(12) United States Patent
Rotker

(10) Patent No.: US 6,708,238 B1
(45) Date of Patent: Mar. 16, 2004

(54) INPUT/OUTPUT CELL WITH A PROGRAMMABLE DELAY ELEMENT

(75) Inventor: Paul S. Rotker, Groton, MA (US)

(73) Assignee: Sun Microsystems, Inc., Palo Alto, CA (US)

( * ) Notice: Subject to any disclaimer, the term of this patent is extended or adjusted under 35 U.S.C. 154(b) by 612 days.

(21) Appl. No.: 09/766,163

(22) Filed: Jan. 19, 2001

(51) Int. Cl.[7] .............................................. G06F 13/00
(52) U.S. Cl. ........................................ 710/58; 713/401
(58) Field of Search .............................. 713/400, 401; 701/1, 52, 58, 61; 716/1

(56) References Cited

U.S. PATENT DOCUMENTS 6,256,681 B1 * 7/2001 Chang ........................... 710/1
6,453,443 B1 * 9/2002 Chen et al. ..................... 716/1
6,487,682 B2 * 11/2002 Yamamura et al. ........... 714/30
6,560,760 B1 * 5/2003 Nagai ............................. 716/9

* cited by examiner

Primary Examiner—Thomas Heckler
(74) Attorney, Agent, or Firm—McCormick, Paulding & Huber LLP

(57) ABSTRACT

An IO cell for providing a transmission path for a binary signal. The IO cell includes an IO buffer for amplifying the binary signal. A programmable delay element is electrically connected to the IO buffer such that the binary signal transmits from the programmable delay element to the IO buffer. The delay element is responsive to "n" number of programmable binary bits to selectively delay transmission of the binary signal by a set of predetermined delay time ranges. An IO pad is connected in series with the IO buffer and the programmable delay element.

37 Claims, 8 Drawing Sheets

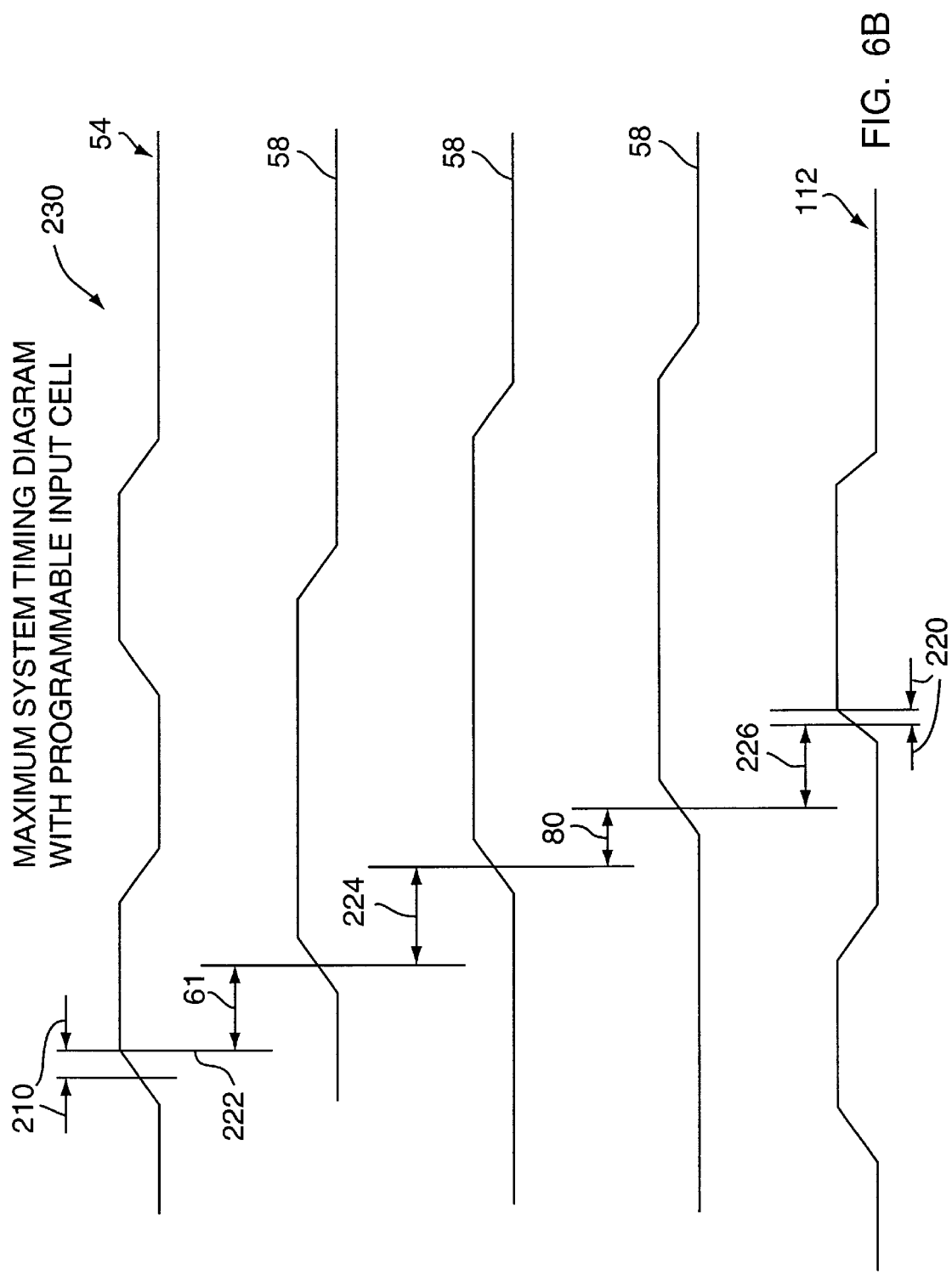

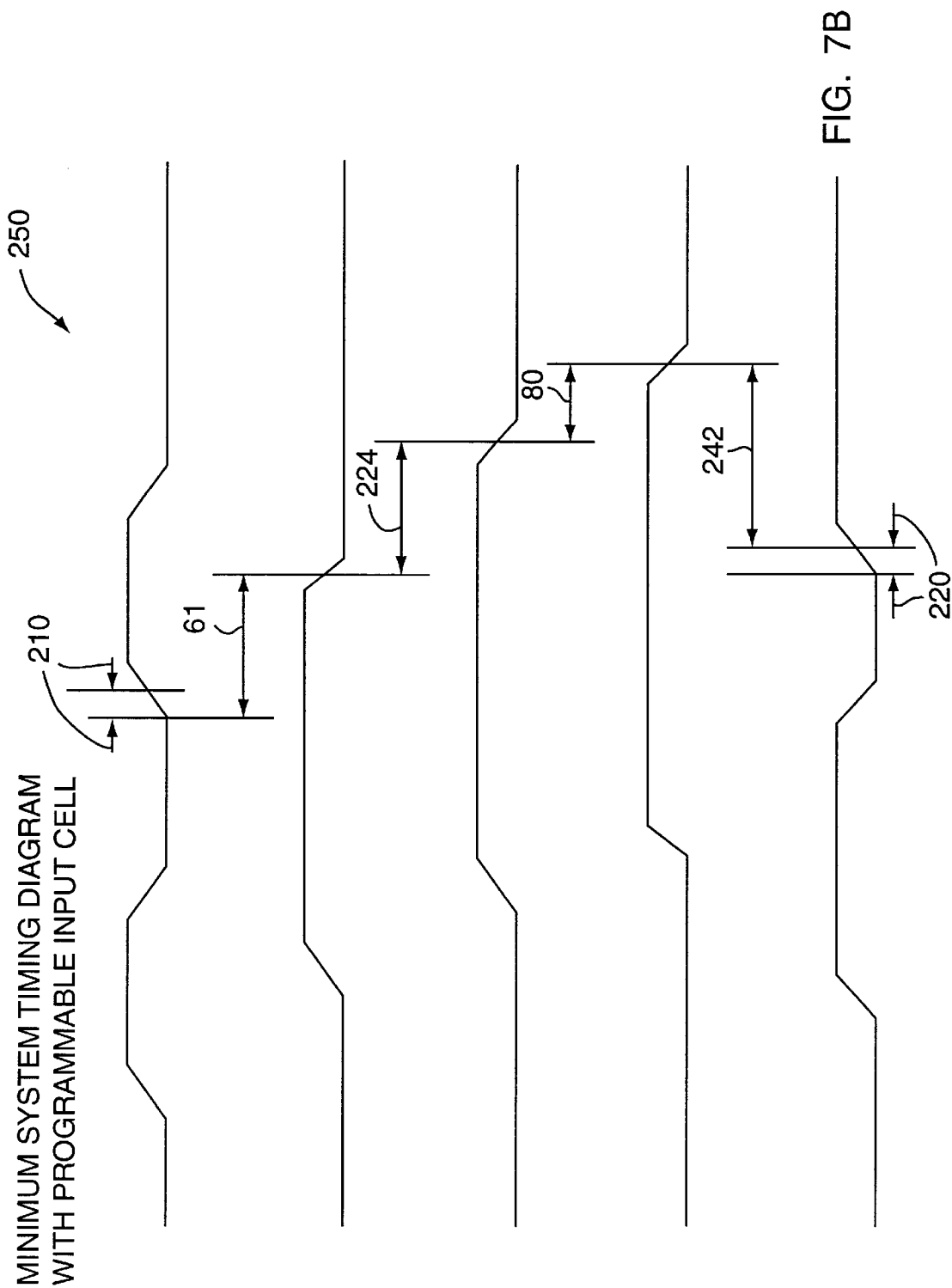

INPUT/OUTPUT CELL WITH A PROGRAMMABLE DELAY ELEMENT

FIELD OF THE INVENTION

The present invention relates to system bus input/output cells for computer systems, and more particularly to an input/output cell with a programmable delay element therein.

BACKGROUND OF THE INVENTION

A system bus is an electronic highway in a digital computer that provides a communication path for data to flow between the central processing unit (CPU) and it's memory unit and between and among the CPU and the various peripheral devices connected to the computer's input/output unit. A system bus contains one wire for each bit needed to specify the address of a device or location in memory, plus additional wires that distinguish among the various data transfer operations to be performed. A system bus can transmit data in either direction between any two components of the computing system through the use of input/output (IO) cells.

IO cells are semiconductor circuit devices generally embedded in a semiconductor material core, which are designed to send (output cells) or receive (input cells) binary data signals throughout the system bus. The IO cell may include a single output cell, a single input cell or any combination of both. By way of examples, IO cells may be used in a system bus for a computer system, or in the various internal busses and system bus interface units within a CPU, or may be stand alone devices on an integrated circuit chip.

To meet the high frequency cycle times of system busses, output cells are designed to be fast. However, this may cause the receiver cells to incorrectly capture the binary signals if the timing requirements for setting up and holding the binary signals are not properly matched between the receiver cells and the output cells. Complicating this is the fact that IO cell can be used across many different platforms, e.g., single processor work stations, single processor servers or multiple processor servers, which can vary in their output time requirements.

Moreover, the input and output response times of these IO cells will vary within different tolerance ranges as ambient conditions change. Generally the fastest response times occur under cold temperatures and high voltage conditions, while the slowest response times occur under hot temperatures and low voltage conditions.

Additionally, the transmission times will vary with the length of the metal traces and the number of logic elements that the signal must propagate through between output cell and receiver cell. In large systems, where the output and receiver cells are generally far apart, the transmission times will be longer because the signal must travel through much longer run lengths. In small systems the transmission times are relatively smaller, because of the shorter runs. When the output cells and input cells are located on a single printed circuit board, the transmission time therebetween is called the board trace delay.

With a single IO cell, having a fixed range of response time, it is very difficult to meet the wide range of minimum/maximum output and input time requirements it may encounter. Prior art IO cells have had to redesign new silicon runs or traces into the IO cells themselves to meet varying conditions. This process can be expensive and time consuming.

Another problem occurs when an Application Specific Integrated Circuit (ASIC) process is used to custom design a system to meet specific customer requirements. It is often difficult to determine the range of variability in the ASIC process required of the IO cell used in the design of the custom system. In order to do so, test boards must be designed with delay elements incorporated onto the test board itself in order to empirically determine the proper delay times to match the output cell timing requirements to the input cell timing requirements. This can increase the time and cost of testing in an ASIC process design.

Accordingly, there is a need for an improved IO cell for the transmission of binary signals.

SUMMARY OF THE INVENTION

The present invention offers advantages and alternatives over the prior art by providing an IO cell with a programmable delay element therein. The delay element enables the tuning of an output IO cell's timing requirements to an input IO cell's timing requirements to provide a transmission path therebetween. Advantageously, the timing requirements of the IO cells may be met in systems with both long and short board trace delays and under various environments conditions. Additionally, the timing requirements of the IO cells in a transmission path can be met without having to redesign new silicon runs or traces into the IO cells.

These and other advantages are accomplished in an exemplary embodiment of the invention by providing an IO cell for providing a transmission path for a binary signal. The IO cell includes an IO buffer for amplifying the binary signal. A programmable delay element is electrically connected to the IO buffer such that the binary signal transmits from the programmable delay element to the IO buffer. The delay element is responsive to "n" number of programmable binary bits to selectively delay transmission of the binary signal by a set of predetermined delay time ranges. An IO pad is connected in series with the IO buffer and the programmable delay element.

In an alternative embodiment of the invention, the IO cell includes an output cell for transmitting the binary signal. The output cell has the IO pad electrically connected to the IO buffer such that the binary signal transmits from the IO buffer to the IO pad.

In another alternative embodiment of the invention, the IO cell includes an input cell for receiving the binary signal. The input cell has the IO pad electrically connected to the programmable delay element such that the binary signal transmits from the IO pad to the programmable delay element.

In another alternative embodiment of the invention, the delay element of the IO cell includes a multiplexer having an output electrically connected to an input of the IO buffer. The multiplexer also has "n" number of selection inputs for receiving the "n" number of the programmable bits and set of mux inputs electrically connected to the binary signal. Each mux input is selectable by the programmable bits to delay transmission of the binary signal by one of the delay time ranges.

BRIEF DESCRIPTION OF THE DRAWINGS

FIG. 6B is a maximum system timing diagram with the programmable delay element on the cell of FIG. 3;

FIG. 7B is a minimum system timing diagram with the programmable delay element on the input cell of FIG. 3.

DETAILED DESCRIPTION OF THE PREFERRED EMBODIMENTS

Figure 1:
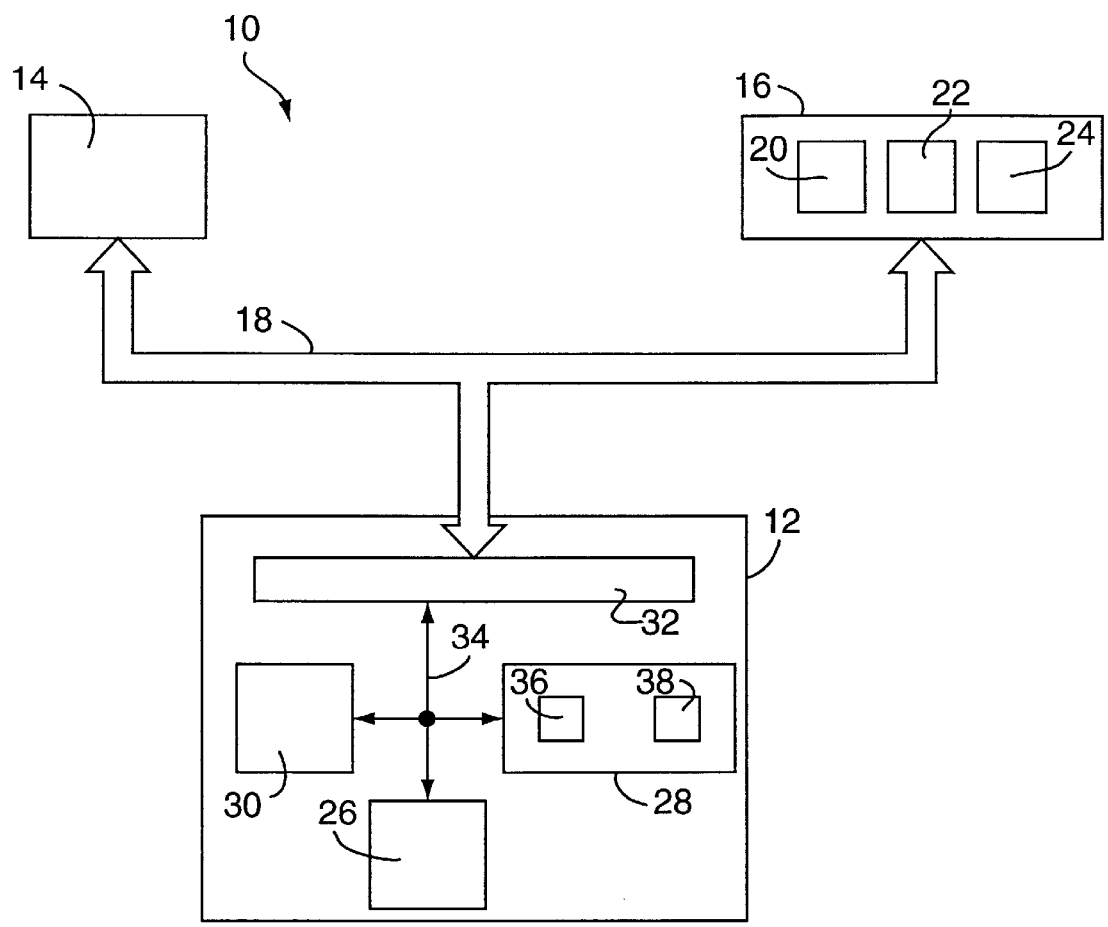
FIG. 1 is a schematic block diagram of a computer system in accordance with the present invention.

Referring to FIG. 1, an exemplary embodiment of a computer system 10 in accordance with the present invention is shown having a CPU 12 for processing binary data signals, an input/output device unit 14 and a memory unit 16, all of which are in communication with one another through a system bus 18. As will be discussed in greater detail hereinafter, IO cells having programmable delay elements enhance the transmission of binary data in either direction between any two components in the computer system 10.

The input/output device unit 14 may be connected to a variety of input/output devices (not shown), e.g., keyboards, disk storage devices, network interfaces, display units, and pointing devices such as a mouse. The memory unit 16 will have one or more types of memory such as various forms of random access memory 20, read only memory 22, and programmable read-only memory 24.

The CPU 12 includes a control unit 26, a variety of execution units 28, and data registers 30 that perform the instructions in a computer program stored in the memory unit 16. There may be many execution units 28, commonly including an arithmetic logic unit 36, a floating-point unit 38, and special-purpose units (not shown). A bus interface unit 32 controls instruction and data transfers to and from the CPU 12, and a plurality of internal buses 34 provide communication between the control unit 26 and the registers 30, the execution units 28 and the bus interface unit 32. The CPU 12 fetches instructions from the memory unit 16, stores results back into the memory unit 16, and exchanges output with the input/output device unit 14.

Figure 2:
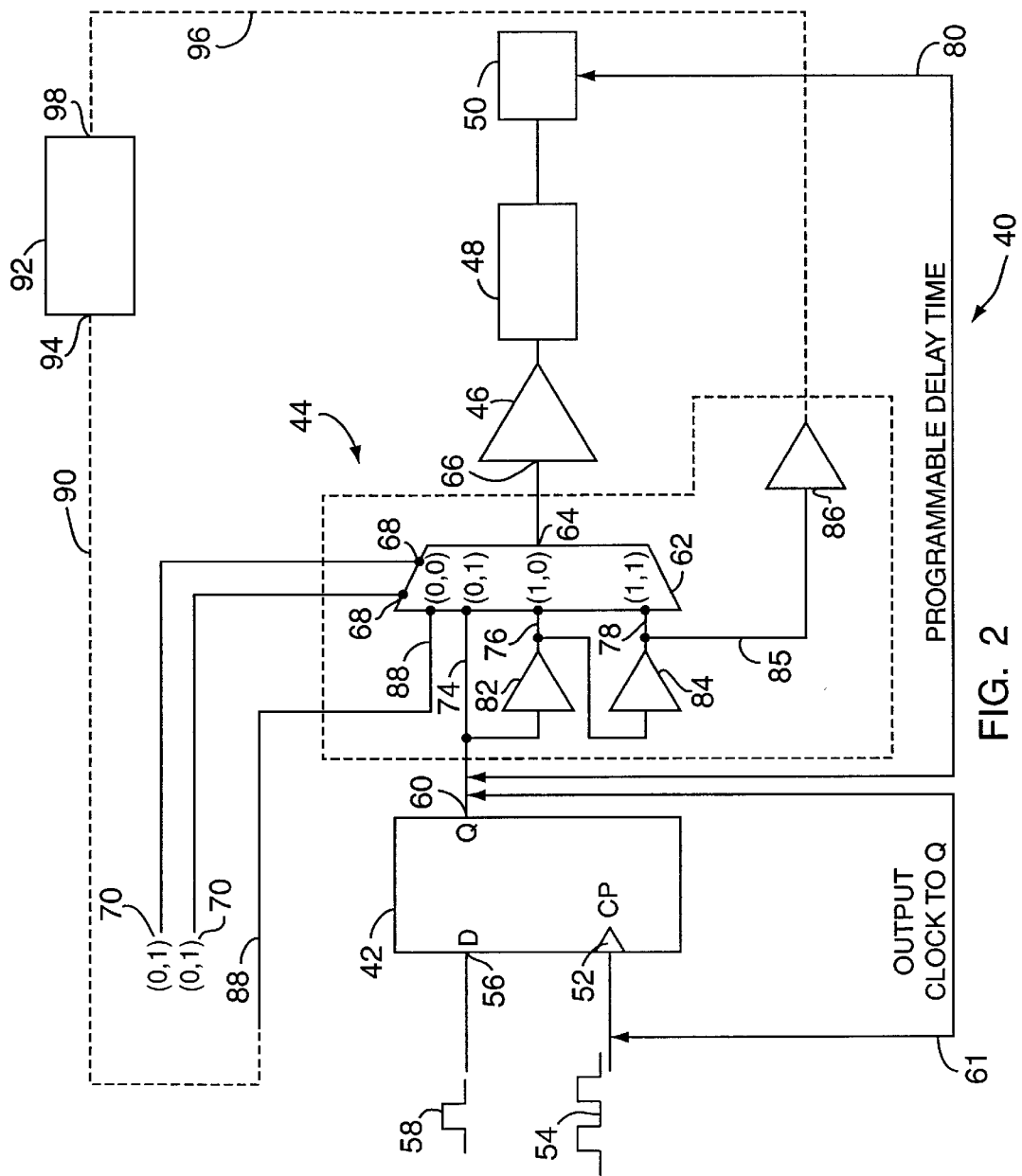
FIG. 2 is a schematic block diagram of an IO cell configured as an output cell with a programmable delay element in accordance with the present invention.

Referring to FIG. 2, an IO cell configured as an output cell in accordance with the present invention is shown generally at 40. The output cell 40 includes a flip flop 42, a programmable delay element 44 (encircled in dotted lines), an IO buffer 46, an electrostatic discharge (ESD) cell and an IO pad 50 all of which are electrically connected in series.

Flip flop 42 is a D type flip flop having a clock pulse (CP) input 52 responsive to an output clock pulse signal 54, a data (D) input 56 electrically connected to a binary data signal 58 and a Q output 60 in electrical series connection to the programmable delay element 44. The flip flop 42 is a binary cell capable of storing one bit of information. The flip flop 42 maintains its a binary state until directed by the clock pulse 54 to switch states. The delay time it take for the binary signal 58 to transmit from the D input 56 to the Q output 60 after a clock pulse 54 is called the Clock-to-Q time (as represented by arrow 61).

There are many different types of flip flops as one skilled in the art would know can be used in the output cell 40. The difference among the various types of flip flops is in the number of inputs they posses and the manner in which the inputs affect the binary state of the outputs. Some of the more common types of flip flops which can be uses are: RS type, D type, JK type and T type flip flops.

Programmable delay element 44 includes a multiplexer 62 having an output 64 electrically connected to an input 66 of the IO buffer 46. A multiplexer is a digital function that receives binary information from $2^n$ input lines and transmits the information on a single output line. The one input line being selected is determined from the bit combination of "n" selection lines, each bit representing a binary 1 or 0. In the present exemplary embodiment, the multiplexer 62 is a 4×1 multiplexer with "n" equal to two. Therefore there are two (n) selection lines 68 responsive to two (n) programmable binary bits 70, for selecting up to four ($2^n$) input lines. As one skilled in the art would recognize, other sized multiplexers may be used to provide any number of programmable delay time options.

The binary bit (70) combinations of 01, 10 and 11 select mux input lines 74, 76 and 78 respectively, which are connected to the Q output 60 and the binary signal 58. Each mux input line delays the transmission of the binary signal 58 from the delay element 44 to the IO pad 50 by a predetermined programmable delay time range (represented by the arrow 80). Mux input line 74 is connected directly to the Q output 60 and selects the smallest delay time range, e.g., 500 pico seconds (ps) to 900 ps in this case. Mux input line 76 is connected in series to the Q output through delay cell buffer 82 and therefore selects a larger predetermined delay, e.g., 600 ps to 1200 ps. Finally, mux input line 78 is in series connection to the Q output through both delay cell buffers 82 and 84 selecting an even larger delay, e.g., 700 ps to 1400 ps.

The binary bit (70) combination of 00 selects external input 88 of the multiplexer 62. The external input 88 is adapted to be electrically connected (as indicated by dotted lines 90) to an external delay element 92 at a first external junction 94. Additionally, an external delay output line 85 electrically connects mux input line 78 to delay cell buffer 86. Through delay cell buffer 86, the external delay output line 85 is adapted to be electrically connected (as indicated by dotted lines 96) to the external delay element 92 at a second external junction 98. Therefore, by selecting the binary bit (70) combination 00, the binary signal 58 can be wrapped through the external delay element and back to mux input 88 for much longer programmed delay times. Alternatively, the output of delay cell buffer 86 can be connected directly to external input 88 to delay transmission of the binary signal 58 through the series combination of the three delay cell buffers 82, 84 and 86.

Once through the multiplexer 62, the binary signal 58 transmits from the multiplexer output 64 through IO buffer 46. The IO buffer 46 does not change the binary value of the signal 58. Rather IO buffer 46 is primarily used for signal amplification to drive the signal 58 through the many other gates of the system external to the output cell 40.

From the output of the IO buffer 46, the signal 58 is conducted through ESD cell 48. The ESD cell 48 is used to protect the output cell 40 from damage due to electrostatic shock, which often occurs when the output cell 40 is being handled during assembly or maintenance. From the ESD cell 48 the binary signal 58 is connected to the external system (not shown) through IO pad 50. The IO pad 50 is generally metallic in composition, very often aluminum, and provides a surface for connecting the output cell 40 to the wiring of the external system, e.g., by welding or soldering.

Figure 3:
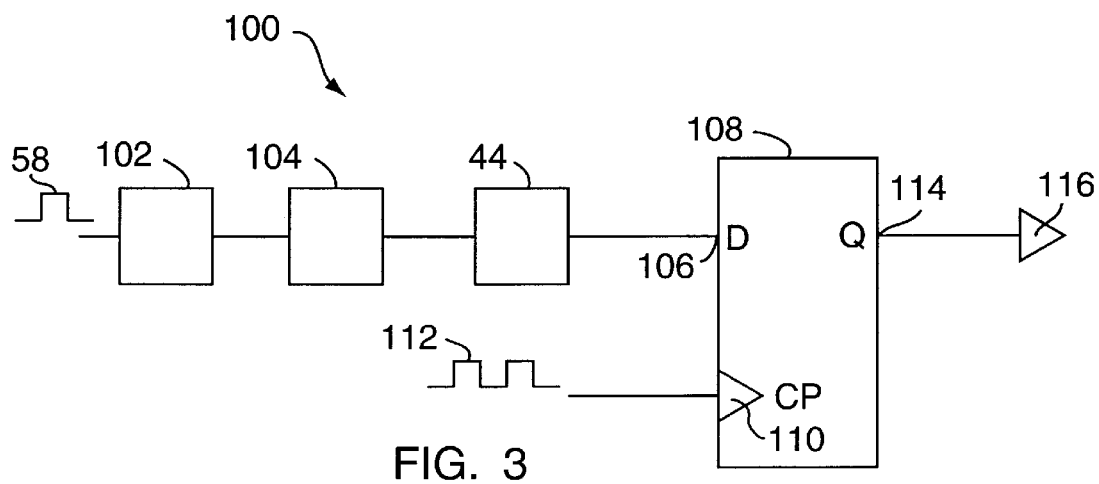
FIG. 3 is a schematic block diagram of an IO cell configured as an input cell with a programmable delay element in accordance with the present invention.

Referring to FIG. 3, an IO cell configured as an input cell is shown generally at 100. The binary signal 58 is transmitted from the output cell 40, through an external system such as a printed circuit board (not shown), where it enters the input cell 100 at receiver IO pad 102. The binary signal 58 is then conducted through the series connected receiver ESD cell 104 and programmable delay element 44 to the D input 106 of receiver flip flop 108. As will be discussed in greater detail hereinafter, the timing of the output cell 40 is advantageously tuned to the timing of the input cell 100 via the programmable delay element 44, in order to properly transmit the binary signal 58.

Flip flop 108 is a D type flip flop having a receiver clock pulse input 110 responsive to a receiver clock pulse signal 112, and a receiver Q output 114 in electrical series connection to a receiver IO buffer 116. The receiver flip flop 108 maintains its binary state until directed by the receiver clock pulse 112 to switch states. At that point the binary signal 58 is transmitted from the D input 106 to the Q output 114 where it is latched until the next receiver clock pulse 112. From the Q output 114, the binary signal 58 is than transmitted through receiver IO buffer 116 where it is amplified and driven through out the rest of the system.

Figure 4:
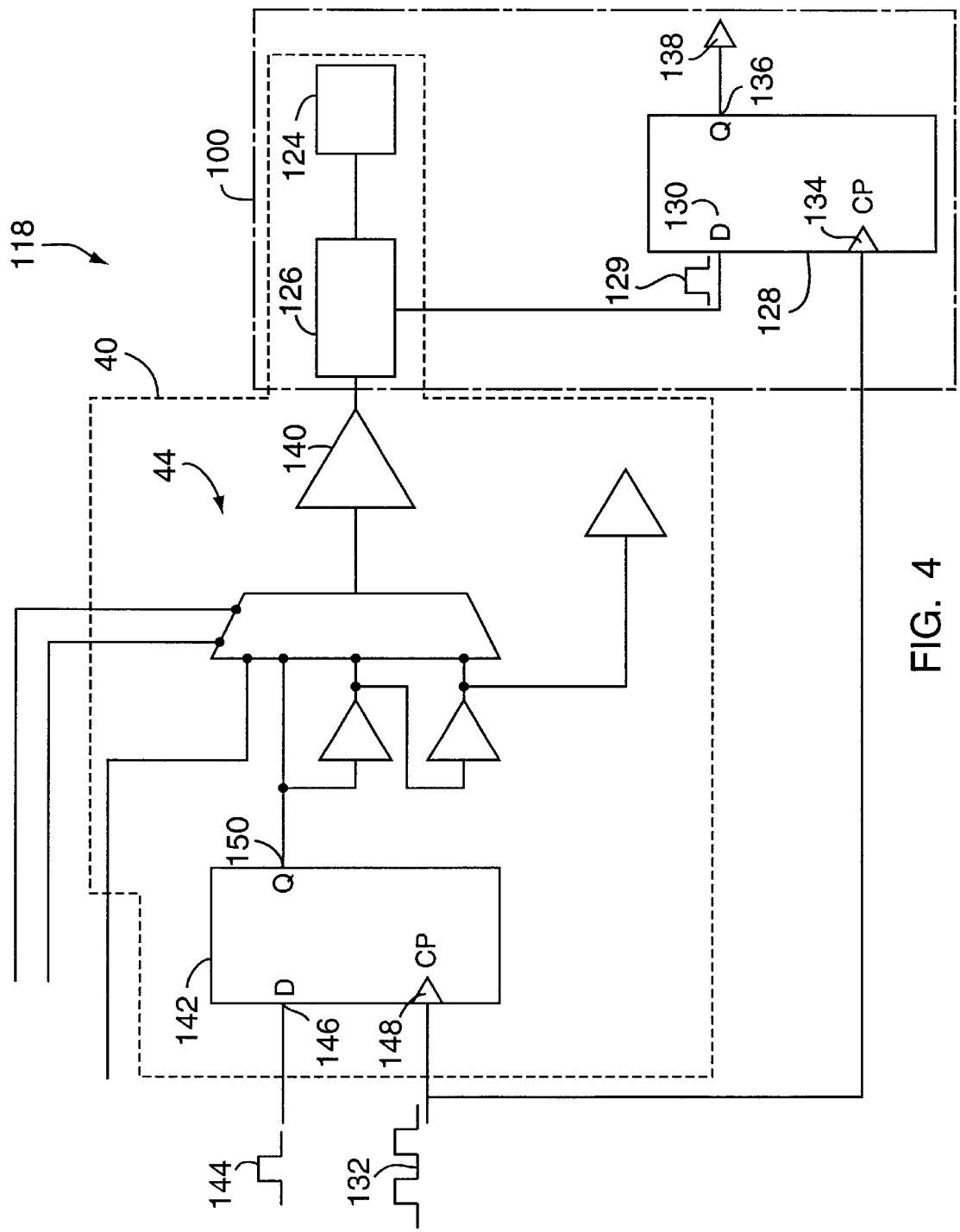
FIG. 4 is a schematic block diagram of an IO cell configured as a bi-directional input/output cell with a programmable delay element in accordance with the present invention.

Referring to FIG. 4, is an exemplary embodiment of an IO cell 118 is configured with both an input cell 100 and an output cell 40 (as shown in the dotted lines). Both input 100 and output 40 cells share a common IO pad 124 and ESD cell 126.

The input cell 100 also includes a receiver flip flop 128 which receives an input binary signal 129 at its D input 130. Common clock pulse 132 drives the receiver flip flop 128 at its clock pulse input 134 and directs the flip flop 128 to transmit the input binary signal 129 from its D input 130 to its Q output 136 where the signal 129 is driven to the rest of the system via receiver IO buffer 138.

The output cell 40 additionally includes an output IO buffer 140, a delay element 44, and an output flip flop 142 which receives an output binary signal 144 at its D input 146. The common clock pulse 132 drives the output flip flop 142 at its clock pulse input 148 and directs the output flip flop 142 to transmit the output binary signal 144 from its D input 146 to its Q output 150. In this embodiment, programmable delay element 44 is located only on the output cell 40.

Figure 5A:
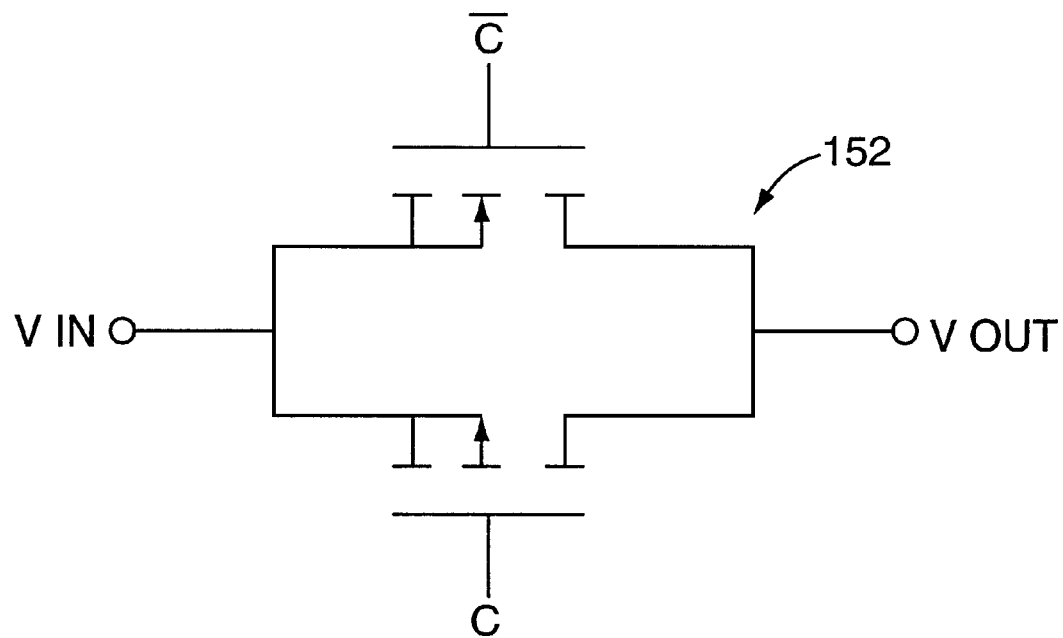
FIG. 5A is a circuit diagram of a CMOS transmission gate used in the delay element in accordance with the present invention.
Figure 5B:
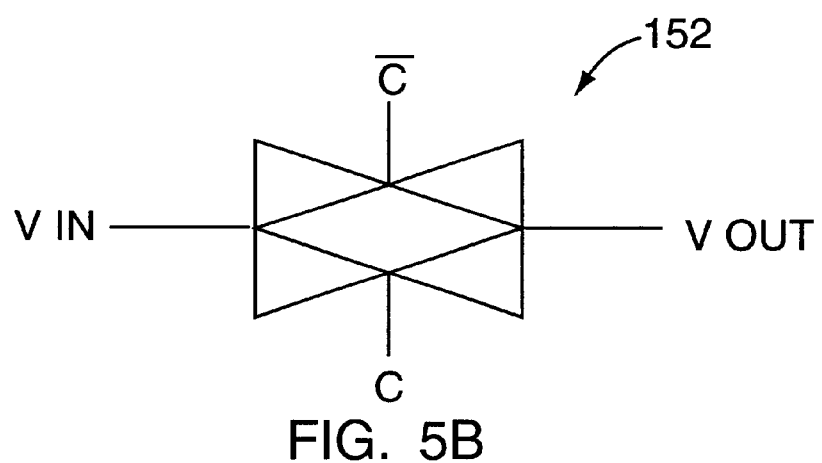
FIG. 5B is a circuit symbol of the CMOS transmission gate of FIG. 5A.

Referring to FIGS. 5A and 5B, even though the programmable delay element is described in this application as being constructed from a multiplexer with delay cell buffers, it will be clear to one skilled in the art that other devices may also be used. For example the delay element 44 may be constructed from a CMOS transmission gate 152, the schematic diagram and circuit symbol of which are shown in FIGS. 5A and 5B respectively. By way of an alternative example, the delay element 44 may be constructed from a resistor/capacitor circuit.

Referring back to FIGS. 2 and 3, in order to properly transmit the binary signal 58, the timing of the output cell 40 is tuned to the timing of the input cell 100, via either one of the programmable elements 44. That is the binary signal 58 is timed to arrive at the D input 106 of the receiver flip flop 108 a predetermined set-up-time (seen in FIG. 6A) ahead of the falling edge of the receiver clock pulse 112, and remain there for a predetermined hold time (seen in FIG. 7A) after the falling edge of the receiver clock pulse 112. If either the set-up-time or hold-time requirements are not met, the binary signal 58 may not be properly transmitted from the D input 106 to the Q output 114 of the receiver flip flop 108 and the data may be lost.

In transmitting from output cell 40 to the input cell 100, the binary signal 58 will encounter a transmission delay time as it passes through the wiring, gates and printed circuit board traces of the external system (not shown). Typically, the external system is a printed circuit board upon which the output cell and input cell are located. Consequently, the external system transmission delay time is known as the board trace delay (seen in FIG. 6A).

For larger external systems with a large number of external gates, and large wires and trace lengths, the board trace delay will be maximal. In these large external systems the binary signal 58 will arrive at the D input 106 of the receiver flip flop 108 in a relatively longe period of time after the output clock pulse 54 on the output flip flop 42 initiates a transmission. As a result, meeting the set-up-time requirements for large external systems are usually a problem. Conversely however, the binary signal 58 is also removed from the D input 106 a relatively long time after the next consecutive output clock pulse 54. Therefore meeting the hold time requirement in a large external system is usually not a problem. This situation is also complicated by the fact that the output clock pulse 54 and the input clock pulse 112, though having the same frequency, may be shifted in time (out of phase) due to their own external system delays. The worse case scenario for a large external system is when the output clock pulse 54 occurs previous to the receiver clock pulse 112.

Figure 6A:
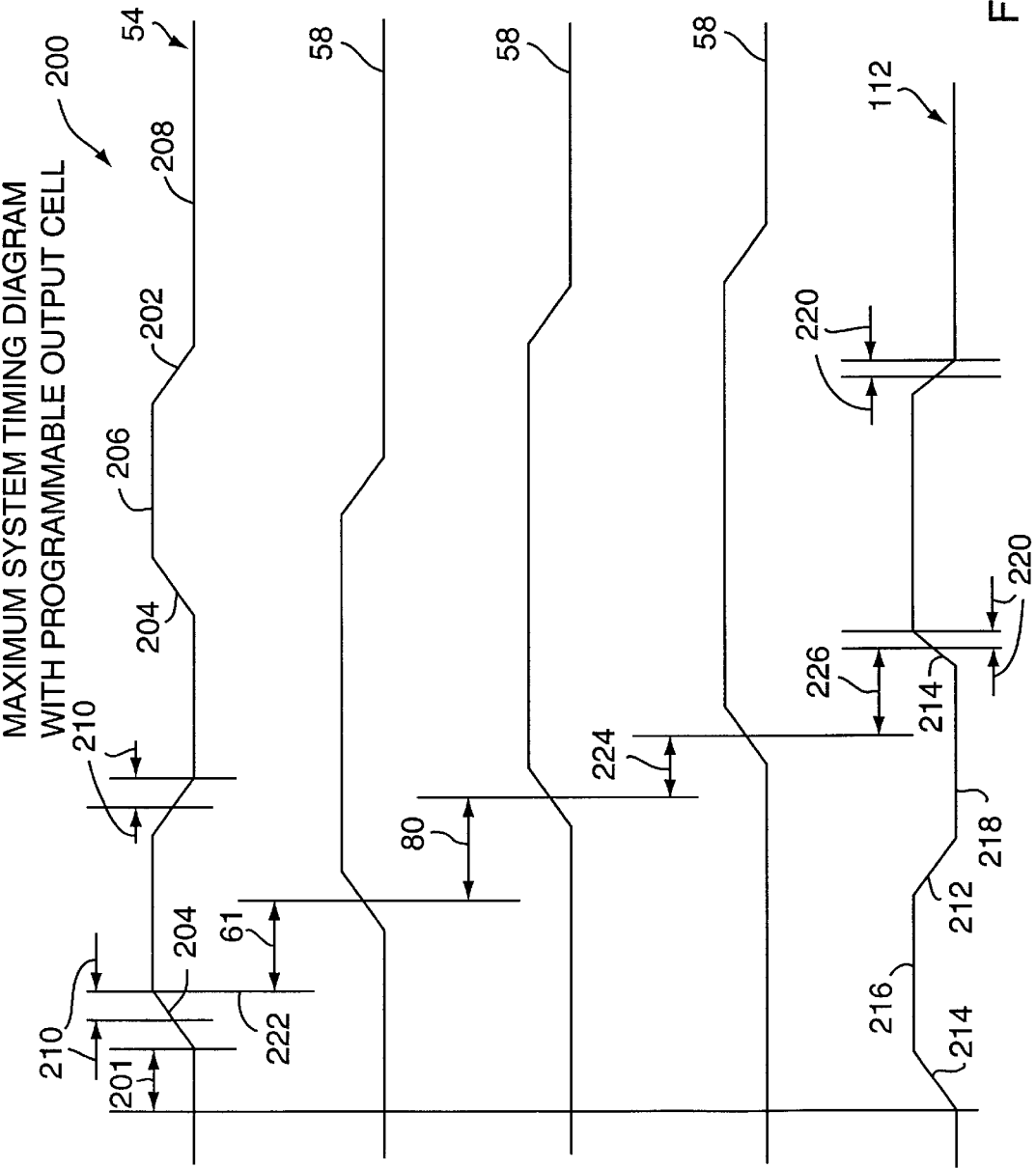
FIG. 6A is a maximum system timing diagram with the programmable delay element on the output cell of FIG. 2.

Referring to FIGS. 2, 3 and 6A, a worse case timing diagram for a large external system is shown generally at 200 wherein the output clock pulse 54 precedes the receiver clock pulse 112 in time as indicated by arrow 201. Each output clock pulse 54 includes a leading (or rising) edge 202, a trailing (or falling) edge 204, a high signal region 206 and a low signal region 208. Each output edge 202 and 204 includes an output skew region 210, i.e., the transition region on the edges 202 and 204 of the output clock pulse 54 where it is difficult to discern between a high signal 206, a low signal 208 and noise. Each input clock pulse 112 also includes a rising edge 212 a falling edge 214, a high signal region 216 and a low signal region 218. Each input edge 212 and 214 also includes a set of skew regions 220.

The output clock pulse 54 will direct a change of state of output flip flop 42 and initiate a transmission of binary signal 58 at transmission starting time 222. The starting time 222 follows immediately before the skew region 210 of the falling edge 204 has reached the output clock pulse input 52 on the output flip flop 42. The binary signal 54 will transfer from the D input 56 to the Q output 60 of the output flip flop 42 in the output clock-to-Q time 61.

At this point, transmission from the Q output 60 to the IO pad 50 of the binary signal 58 will be delayed by a predetermined programmable delay time 80, selected by the delay element 44 of the output cell 40. In this embodiment, the delay element 44 of the input cell 100 is not being used to control transmission times.

The binary signal 58 will transmit from the IO pad 50, through the external system, and arrive at the D input 106 of the receiver flip flop 108 a board trace delay time 224 later.

The set-up-time requirements of the receiver flip flop 108 must be met, in order for the receiver flip flop 108 to properly transfer and lock the binary signal 58 from its D input 106 to its Q output 114. That is, the binary signal 58 must arrive at the D input 106 a predetermined set-up-time 226 ahead of the skew region 220 of the falling edge 214 of receiver clock pulse 112.

Referring to FIGS. 2, 3, and 6B, an alternative timing diagram for a large external system is shown generally at 230 wherein the delay element 44 on the input cell 100 is used to control transmission delay time of the binary signal 58. In this case the board trace delay time 224 occurs before the programmable delay time 80.

Referring back to FIGS. 2 and 3, for external systems with a small number of external gates, and small wires and trace lengths, the board trace delay will be minimal. In these small external systems the binary signal 58 will arrive at the D input 106 of the receiver flip flop 108 in a relatively short period of time after the output clock pulse 54 on the output flip flop 42 initiates a transmission. As a result, meeting the set-up-time requirements for small external systems are usually not a problem. Conversely however, the binary signal 58 will also be removed from the D input 106 in a relatively small amount of time after the next consecutive output clock pulse 54. Therefore, meeting the hold-time requirements in a small external system can often be a problem. The worse case scenario for a small external system is when the receiver clock pulse 112 occurs previous to the output clock pulse 54.

Figure 7A:
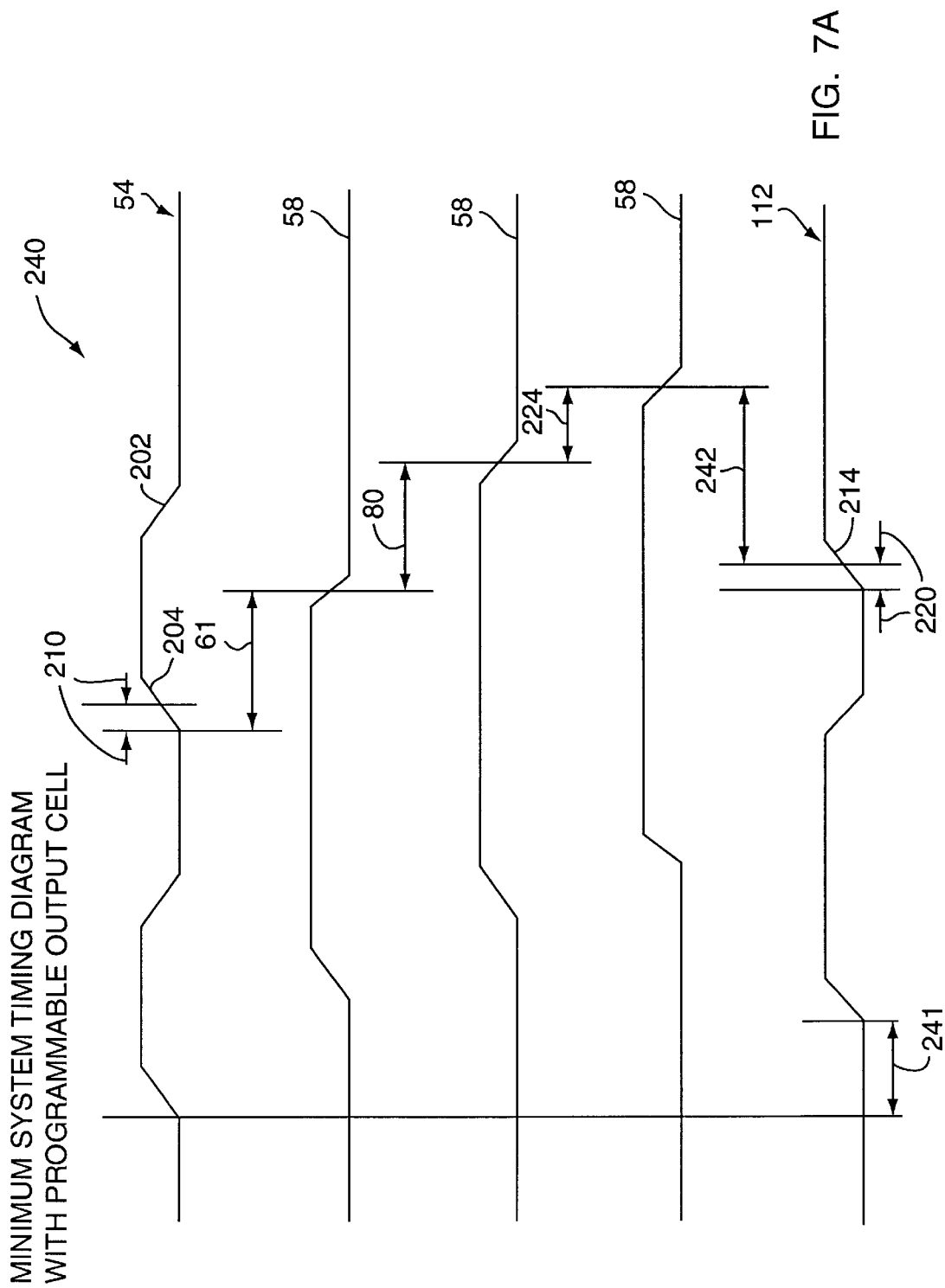
FIG. 7A is a minimum system timing diagram with the programmable delay element on the output cell of FIG. 2.

Referring to FIGS. 2, 3 and 7A, a worse case timing diagram for a small external system is shown generally at 240 wherein the receiver clock pulse 112 precedes the output clock pulse 54 in time as indicated by arrow 241. In this case it is assumed that the binary signal 58 has arrived at the D input 106 of the receiver flip flop 108 in time to meet the set-up-time requirements.

When the skew region 210 of the falling edge 204 of the next consecutive output clock pulse 54 clears the D input 56 of the output flip flop 42, the binary signal 58 is removed from the Q output 60 a clock-to-Q 61 period of time later. A programmable period of time 80 later, the binary signal 58 is than removed from the IO pad 50 of the output cell 40. Finally the binary signal 58 is removed from the D input 106 of the receiver flip flop 108 a board trace delay 224 period of time later.

The hold time requirements of the receiver flip flop 108 must be met, in order for the receiver flip flop 108 to properly transfer and lock the binary signal 58 from its D input 106 to its Q output 114. That is, the binary signal 58 must remain at the D input 106 a predetermined hold time 242 ahead of the skew region 220 of the falling edge 214 of receiver clock pulse 112.

Referring to FIGS. 2, 3, and 7B, an alternative timing diagram for a small external system is shown generally at 250 wherein the delay element 44 on the input cell 100 is used to control transmission delay time of the binary signal 58. In this case the board trace delay time 224 occurs before the programmable delay time 80.

The falling edges 204 and 214 of the output clock pulse 54 and receiver clock pulse 112 respectively are described and shown in this application as the edges from which the binary signal 58 timing requirements are measured. However, it will be clear to one skilled in the art that the rising edges 202 and 212 of the clock pulses 54 and 112 respectively may also be used.

While preferred embodiments have been shown and described, various modifications and substitutions may be made thereto without departing from the spirit and scope of the invention. Accordingly, it is to be understood that the present invention has been described by way of illustration and not limitation.

What is claimed is:

1. An IO cell for providing a transmission path for a binary signal, the IO cell comprising:
    an IO buffer for amplifying the binary signal;
    a programmable delay element electrically connected to the IO buffer such that the binary signal transmits from the programmable delay element to the IO buffer, wherein the delay element is responsive to "n" number of programmable binary bits to selectively delay transmission of the binary signal by a set of predetermined delay time ranges; and
    an IO pad in series electrical connection with the IO buffer and the programmable delay element.

2. The IO cell of claim 1 wherein the IO cell further comprises an output cell for transmitting the binary signal, the output cell having the IO pad electrically connected to the IO buffer such that the binary signal transmits from the IO buffer to the IO pad.

3. The IO cell of claim 1 wherein the IO cell further comprises an input cell for receiving the binary signal, the input cell having the IO pad electrically connected to the programmable delay element such that the binary signal transmits from the IO pad to the programmable delay element.

4. The IO cell of claim 1 wherein the delay element further comprises:
    a multiplexer having,
        an output electrically connected to an input of the IO buffer,
        "n" number of selection inputs for receiving the "n" number of the programmable bits,
        a set of mux inputs electrically connected to the binary signal, each mux input selectable by the programmable bits to delay transmission of the binary signal by one of the delay time ranges.

5. The IO cell of claim 4 wherein the multiplexer further includes an external input selectable by the programmable bits, the external input adapted to be electrically connected to an external delay element at a first external junction.

6. The IO cell of claim 5 wherein the delay element further includes an external delay output line electrically connected to one of the mux inputs, and adapted to be electrically connected to the external delay element at a second external junction.

7. The IO cell of claim 4 wherein the delay element further includes a plurality of delay cell buffers electrically connected to the set of mux inputs to provide the selectable delay time ranges.

8. The IO cell of claim 1 further comprising a flip flop having,
    a clock pulse input electrically connected and responsive to a clock pulse,
    a data input electrically connected to the binary signal, and
    a Q output electrically connected to the programmable delay element,
    wherein when an edge of the clock pulse reaches the clock pulse input, the binary signal is transmitted from the data input to the Q output in a predetermined clock-to-Q time period range.

9. The IO cell of claim 1 wherein the IO cell is embedded in a semiconductor material core.

10. The IO cell of claim 1 wherein the delay element further comprises a CMOS transmission gate.

11. The IO cell of claim 1 further comprising an electrostatic discharge protection cell electrically connected between the IO buffer and the IO pad.

12. A system bus adapted to provide electrical communication between a central processing unit, a memory unit and an input/output unit, the system bus comprising:
 an IO cell for providing a transmission path for a binary signal, the IO cell including,
  an IO buffer for amplifying the binary signal,
  a programmable delay element electrically connected to the IO buffer such that the binary signal transmits from the programmable delay element to the IO buffer, wherein the delay element is responsive to "n" number of programmable binary bits to selectively delay transmission of the binary signal by a set of predetermined delay time ranges, and
  an IO pad in series electrical connection with the IO buffer and the programmable delay element.

13. The system bus of claim 12 wherein the IO cell further comprises an output cell for transmitting the binary signal, the output cell having the IO pad electrically connected to the IO buffer such that the binary signal transmits from the IO buffer to the IO pad.

14. The system bus of claim 12 wherein the IO cell further comprises an input cell for receiving the binary signal, the input cell having the IO pad electrically connected to the programmable delay element such that the binary signal transmits from the IO pad to the programmable delay element.

15. The system bus of claim 12 wherein the delay element further comprises:
 a multiplexer having,
  an output electrically connected to an input of the IO buffer,
  "n" number of selection inputs for receiving the "n" number of the programmable bits,
  a set of mux inputs electrically connected to the binary signal, each mux input selectable by the programmable bits to delay transmission of the binary signal by one of the delay time ranges.

16. The system bus of claim 15 wherein the multiplexer further includes an external input selectable by the programmable bits, the external input adapted to be electrically connected to an external delay element at a first external junction.

17. The system bus of claim 12 further comprising a flip flop having,
 a clock pulse input electrically connected and responsive to a clock pulse,
 a data input electrically connected to the binary signal, and
 a Q output electrically connected to the programmable delay element,
 wherein when an edge of the clock pulse reaches the clock pulse input, the binary signal is transmitted from the data input to the Q output in a predetermined clock-to-Q time period range.

18. A computer system comprising:
 an input/output unit for interfacing with input/output devices;
 a memory unit having a memory for storing data;
 a central processing unit for performing data processing;
 a system bus in electrical communication between the central processing unit, the input/output unit and the memory unit; and
 an IO cell for providing a transmission path within the computer system for a binary signal, the IO cell including,
  an IO buffer for amplifying the binary signal,
  a programmable delay element electrically connected to the IO buffer such that the binary signal transmits from the programmable delay element to the IO buffer, wherein the delay element is responsive to "n" number of programmable binary bits to selectively delay transmission of the binary signal by a set of predetermined delay time ranges, and
  an IO pad in series electrical connection with the IO buffer and the programmable delay element.

19. The computer system of claim 18 wherein the IO cell further comprises an output cell for transmitting the binary signal, the output cell having the IO pad electrically connected to the IO buffer such that the binary signal transmits from the IO buffer to the IO pad.

20. The computer system of claim 18 wherein the IO cell further comprises an input cell for receiving the binary signal, the input cell having the IO pad electrically connected to the programmable delay element such that the binary signal transmits from the IO pad to the programmable delay element.

21. The computer system of claim 18 wherein the delay element further comprises:
 a multiplexer having,
  an output electrically connected to an input of the IO buffer,
  "n" number of selection inputs for receiving the "n" number of the programmable bits,
  a set of mux inputs electrically connected to the binary signal, each mux input selectable by the programmable bits to delay transmission of the binary signal by one of the delay time ranges.

22. The computer system of claim 21 wherein the multiplexer further includes an external input selectable by the programmable bits, the external input adapted to be electrically connected to an external delay element at a first external junction.

23. The computer system of claim 18 further comprising a flip flop having,
 a clock pulse input electrically connected and responsive to a clock pulse,
 a data input electrically connected to the binary signal, and
 a Q output electrically connected to the programmable delay element,
 wherein when an edge of the clock pulse reaches the clock pulse input, the binary signal is transmitted from the data input to the Q output in a predetermined clock-to-Q time period range.

24. A central processing unit for performing data processing comprising:
 an IO cell for providing a transmission path for a binary signal, the IO cell including,
  an IO buffer for amplifying the binary signal,
  a programmable delay element electrically connected to the IO buffer such that the binary signal transmits from the programmable delay element to the IO buffer, wherein the delay element is responsive to "n" number of programmable binary bits to selectively delay transmission of the binary signal by a set of predetermined delay time ranges, and
  an IO pad in series electrical connection with the IO buffer and the programmable delay element.

25. The central processing unit of claim 24 wherein the IO cell further comprises an output cell for transmitting the binary signal, the output cell having the IO pad electrically connected to the IO buffer such that the binary signal transmits from the IO buffer to the IO pad.

26. The central processing unit of claim 24 wherein the IO cell further comprises an input cell for receiving the binary signal, the input cell having the IO pad electrically connected to the programmable delay element such that the binary signal transmits from the IO pad to the programmable delay element.

27. The central processing unit of claim 24 wherein the delay element further comprises:

a multiplexer having,
an output electrically connected to an input of the IO buffer,
"n" number of selection inputs for receiving the "n" number of the programmable bits,
a set of mux inputs electrically connected to the binary signal, each mux input selectable by the programmable bits to delay transmission of the binary signal by one of the delay time ranges.

28. The central processing unit of claim 27 wherein the multiplexer further includes an external input selectable by the programmable bits, the external input adapted to be electrically connected to an external delay element at a first external junction.

29. The central processing unit of claim 24 further comprising a flip flop having, a clock pulse input electrically connected and responsive to a clock pulse,
a data input electrically connected to the binary signal, and
a Q output electrically connected to the programmable delay element,
wherein when an edge of the clock pulse reaches the clock pulse input, the binary signal is transmitted from the data input to the Q output in a predetermined clock-to-Q time period range.

30. A method of tuning an output cell's timing requirements to an input cell's timing requirements to provide a transmission path for a binary signal, the method comprising:

setting a predetermined delay time range with a programmable delay element included in either of the output cell and the input cell; and
delaying transmission of the binary signal by the predetermined delay time range.

31. The method of claim 30 further comprising:

driving an output flip flop of the output cell with an output clock pulse to transfer the binary signal from a data input to a Q output of the output flip flop to transmit the binary signal; and
driving a receiver flip flop of the receiver cell with a receiver clock pulse to transfer the binary signal from a data input to a Q output of the receiver flip flop to receive the binary signal.

32. The method of claim 31 further comprising:

timing the binary signal to arrive at the data input of the receiver flip flop within a predetermined set-up-time range ahead of an edge of the receiver clock pulse.

33. The method of claim 32 wherein the timing further comprises arriving at the data input of the receiver flip flop within a predetermined set-up-time range ahead of a skew region of the edge of the receiver clock pulse.

34. The method of claim 31 further comprising:

timing the binary signal to remain at the data input of the receiver flip flop for a predetermined hold-time range after an edge of the receiver clock pulse.

35. The method of claim 34 wherein the timing further comprises remaining at the data input of the receiver flip flop within a predetermined hold-time range ahead of a skew region of the edge of the receiver clock pulse.

36. The method of claim 30 wherein setting further comprises:

setting "n" number of programmable bits to provide a binary bit combination;
selecting an input line from a set of input lines to the delay element from the binary bit combination; and
providing a predetermined delay time range from the input line selected.

37. The method of claim 30 wherein setting further comprises:

setting "n" number of programmable bits to provide a binary bit combination;
selecting an input line from the binary bit combination;
connecting the selected input line to an external delay element; and
providing a predetermined delay time range from the external delay element connected to the selected input line.

* * * * *